United States Patent [19]

Lawson

[11] 4,191,569

[45] Mar. 4, 1980

[54] TREATING DEVELOPED LITHOPLATE WITH OLEOPHILIC COMPOSITION

[75] Inventor: Leslie E. Lawson, Kent, England

[73] Assignee: Vickers Limited, London, England

[21] Appl. No.: 818,572

[22] Filed: Jul. 25, 1977

[30] Foreign Application Priority Data

Jul. 26, 1976 [GB] United Kingdom ............... 31136/76

[51] Int. Cl.[2] .......................... G03F 7/02; G03C 1/58; G03C 5/22

[52] U.S. Cl. .................................... 430/305; 101/456; 101/457; 101/458; 101/466; 101/467

[58] Field of Search ...................... 96/49, 33; 101/456, 101/457, 458, 466, 467

[56] References Cited

U.S. PATENT DOCUMENTS

| | | | |
|---|---|---|---|
| 2,865,873 | 12/1958 | Hodgins et al. | 96/33 X |
| 3,276,360 | 10/1966 | Stimson et al. | 96/49 X |
| 3,313,233 | 4/1967 | Uhlig et al. | 96/33 X |
| 3,406,065 | 10/1968 | Uhlig | 96/33 |
| 3,595,653 | 7/1971 | Steppan et al. | 96/49 X |
| 3,634,086 | 1/1972 | Lawson | 96/49 |
| 3,762,325 | 10/1973 | Hallman et al. | 101/453 |
| 4,123,279 | 10/1978 | Kobayashio | 96/33 X |

*Primary Examiner*—Edward C. Kimlin
*Attorney, Agent, or Firm*—Reed, Smith, Shaw & McClay

[57] ABSTRACT

A positive working radiation sensitive plate is image-wise exposed, developed and desensitized, and dried. Thereafter an oleophilic composition including a solvent capable of softening the image is applied to the plate and the plate is then washed to remove the oleophilic composition from the non-image areas. The image accepts ink readily even when the image-wise exposure is effected using a continuous tone original in the absence of a half-tone screen.

10 Claims, No Drawings

TREATING DEVELOPED LITHOPLATE WITH OLEOPHILIC COMPOSITION

This invention relates to the processing of radiation sensitive plates in lithographic printing plate production.

As is well known, lithographic printing plates are conventionally produced from radiation sensitive plates comprising a substrate coated with a layer of radiation sensitive material which on exposure to actinic radiation becomes more or less soluble in suitable developers than the unexposed material. Thus, in the case of the so called positive-working plates the radiation-struck portions of the layer become more easily removable from the substrate than the non-radiation-struck portions and in the case of the so called negative-working plates, the non-radiation-struck portions of the layer remain more easily removable from the substrate than the radiation-struck portions. In each case, the portions remaining on the substrate after development form the image areas and the underlying substrate revealed on development constitute the non-image areas.

To produce prints from continuous tone originals using such radiation-sensitive plates, it is the usual practice to create a master in the form of a photographic positive or negative reproduction of the original in which the tones are represented by regularly spaced dots of various sizes. The plate is then exposed whilst it is in contact with said master whereby the plate is provided with image areas comprising regularly spaced dots, known as half-tone dots, which vary in size in direct relationship to the tones being matched. The dots are normally so small that the presence of the individual dots is not readily distinguishable to the naked eye. However their size variations create the optical illusion of variation in tonal value.

This system suffers from the inherent and limiting disadvantage that the resultant regularly disposed dot image sometimes clashes with the detail and form of the subject matter and results in "patterning." Moreover, when two or more similarly disposed images are superimposed, as occurs when reproducing multicoloured originals, moire patterns may occur. Also, a special half tone screen has to be employed at one stage in the reproduction method, and this is not only difficult to make and hence expensive but also requires considerable skill and expenditure of time by the user.

Recently there have been attempts to carry out so-called continuous-tone or screenless lithography in which the printing plate is prepared without using a half-tone screen. One particular type of radiation sensitive plate which has proved particularly suitable for this process comprises a substrate formed of electrograined and anodised aluminium coated with a positive-working radiation sensitive material comprising a suitable phenolformaldehyde resin such as a novolak resin and a suitable sensitiser such as a quinone diazide or a diazonium salt. After exposure through only a continuous tone positive the plate is treated with an appropriate alkaline developer and desensitised with gum arabic. This process depends on the fact that during the development of the plate, the radiation-sensitive material is removed in proportion to the amount of radiation to which it has been subjected, such removal taking place from the free surface of the material which obviously receives most light. Thus, the image areas of the plate corresponding to the lighter tones of the original comprise only microscopically thin layers of material lodged in the recesses in the surface grain of the plate. Although this process can be tolerably successful, the image areas consisting of these thin layers of material corresponding to the lighter tones do not accept ink easily at the onset of the printing operation. More than 100 copies frequently have to be taken before acceptable results are obtained and normal manual inking has proved to be both difficult and unreliable.

It has now been surprisingly found that the ink acceptability of the image areas can be greatly improved by treating the developed and desensitised plate with a special liquid composition.

Accordingly the present invention provides a method of processing a radiation sensitive plate comprising a substrate coated with a layer of a positive-working radiation sensitive material, which method comprises:

(i) image-wise exposing the layer to actinic radiation so that the layer includes radiation-struck portions and non-radiation-struck portions, (ii) developing the image-wise exposed layer to selectively remove the radiation-struck portions of the layer and reveal the substrate underlying these portions and desensitising the revealed substrate to render the same oleophobic (iii) drying the developed and desensitised plate, (iv) coating the whole of the dried plate with a liquid composition comprising an oleophilic film-forming material and an organic solvent liquid which is capable of softening the surface of the non-radiation-struck portions, (v) drying the coated plate to form an oleophilic layer on the non-radiation struck portions and on said revealed substrate, and (vi) washing the plate to remove the oleophilic layer from said revealed substrate.

The method of the present invention is particularly suitable in the case where the radiation sensitive plate is exposed using a continuous tone positive (i.e. without recourse to the use of a half-tone screen) in the manner above described. In this case, the substrate is a grained substrate, preferably an aluminium substrate electrochemically grained using alternating current and dilute hydrochloric acid as electrolyte.

The method of the present invention may, however, also be practised in the case where a half tone screen is used in the preparation of the plate.

The radiation sensitive material may be any suitable positive-working material such as a diazonium salt or quinone diazide optionally in admixture with an alkali soluble resin such as a novolak resin or other phenol-formaldehyde resin.

When carrying out the method of the present invention it is preferred to effect the development of the image-wise exposed layer and the desensitisation of the revealed substrate in a single processing step. This is effected by utilising a developer which also has a desensitising effect. Examples of such developers can be found in UK patent specification No. 881,593 and U.S. Pat. No. 3,110,596. The preferred developer is an alkali silicate such as sodium silicate but other desensitising developers such as trisodium phosphate or trisodium citrate may be used.

The liquid composition applied to the dried plate in accordance with the present invention should be of low viscosity in order to facilitate applying the same and the nature and amount of the organic solvent liquid present in the composition will be dependent on the nature of the radiation sensitive material of the plate. Examples of organic solvent liquids which have been found to be useful in conjunction with radiation sensitive materials based on novolak resins sensitised with quinone diazides or diazonium salts are alcohols such as ethanol, isopropanol, n-butanol, 2-ethyl hexanol or 1-octanol; esters such as n-hexyl acetate, diethyl phthalate or diethyl carbonate; ketones such as 2,6-dimethyl heptanone, 3-methyl-2-pentanone or 4-methyl-2-pentanone; a lactone such as γ-butyrolactone or a lactam such as 1-methyl-2-pyrrolidinone. The nature and amount of organic solvent liquid should be such that the organic solvent liquid only softens the surface of the image material and does not result in the removal of any significant amount of the material. The film-forming oleophilic material may be, for example, a normally solid hydrocarbon or fat in solution in a liquid hydrocarbon. Examples of suitable normally solid materials are asphaltum (gilsonite), naturally occurring waxes, paraffin waxes and/or fats such as tallow and examples of suitable liquid hydrocarbons are mineral oils, turpentine and/or white spirit. The liquid composition may include a conventional pigment and/or dye such as carbon black, or Phthalocyanine Blue Pigment and can readly be formulated so that it is of low viscosity. Typically, the liquid composition comprises from 0.5 to 5% by weight of normally sold hydrocarbon and/or fat, from 60 to 95% by weight of liquid hydrocarbon, from 0.1 to 30% by weight of the organic solvent liquid and up to 5% by weight of pigment and/or dye. Whilst the pigment and/or dye is not essential in respect of increasing the ink acceptance of the image areas, its presence allows the treated plate to be visibly inspected to check whether the lighter tones have become ink accepting before the plate is put on the press. The oleophilic layer is preferably a grey-black colour, but maybe any other suitable colour. It is preferable but not essential that the oleophilic layer is non-drying i.e. does not react with the air to harden or polymerise. The plate obtained in accordance with the present invention may be heated to harden the image areas to increase the length of the printing run if desired.

In a particularly preferred embodiment, the washing of the plate is effected using an aqueous solution containing an organic solvent liquid such as an alcohol and an alkaline material such as trisodium phosphate or an acidic material such as phosphoric acid to aid removal of the oleophilic layer from the revealed substrate (th non-image areas); polymeric desensitising materials such as gum arabic, dextrin or sodium alginate; and/or wetting agents. If desired the plate may be simply protected by applying a thin layer of inert colloidal material and drying, after which it can be fastened to a suitable printing press and used to produce copies. Alternatively the plate may be further wet-inked with black ink in the traditional manner, or it may be washed out and wet-inked with the coloured ink to be used to obtain the required copies.

The following Examples illustrate the invention. In these Examples all percentages and parts are expressed on a weight basis.

EXAMPLE 1

A composition was made containing:

White spirit: 88%;
Mineral oil: 6%;
4-Methyl pentane-2-one: 2%;
Asphaltum: 2.5%;
Carbon black: 1.25%;
Tallow: 0.25%;

A positive-working printing plate was prepared comprising a substrate formed of aluminium which had been electrochemically grained in hydrochloric acid electrolyte using alternating current and anodised in sulphuric acid electrolyte using direct current and a positive working radiation sensitive coating comprising a mixture of 1 part of the α-naphthol ester of naphthoquinone 1,2-diazide 2,5-sulphonic acid and 4 parts of a cresol-based novolak resin (VL 6859 Bakelite GmbH). The coating weight was 2 g/m$^2$. The coating was exposed to actinic light for 3 minutes through a continuous tone positive and developed with a desensitising developer comprising an aqueous solution of a mixture of trisodium phosphate (5%) and sodium silicate (2%) having a pH of 13.6. The sodium silicate used was Grade H120 of Joseph Crossfield and Sons Ltd, Warrington. The developed plate was washed and then dried. The above composition was applied and burnished down to form an even layer having a thickness less than the depth of the grain. When the resultant oleophilic layer was dry, the plate was cleaned with an aqueous solution of dilute gum arabic (1%) to selectively remove the oleophilic layer from the areas of the substrate revealed on development. The plate was finally protected by applying gum arabic solution in the usual way.

Visible inspection of the plate showed that the lighter tones had accepted the liquid composition and this suggested that they would print correctly and without difficulty. When placed on an offset printing press and washed out in the normal manner, good screenless copies of the tone subject represented on the continuous tone positive were obtained within 15 revolutions of the press.

EXAMPLE 2

Example 1 was repeated except that the developer was an aqueous solution of 0.2% sodium hydroxide and 2% sodium silicate. The sodium silicate was that marketed by Joseph Crossfield & Sons Ltd, under the designation Number 1. Similar results were obtained

EXAMPLE 3

Example 1 was repeated using as the developer a 5% solution of sodium metasilicate containing 10% polyethyleneglycol and as the aqueous cleaning solution a 3% aqueous solution of dextrin to which 0.5% phosphoric acid and 5% isopropanol had been added. Similar results were obtained.

EXAMPLE 4

Example 1 was repeated using water to clean the plate. Whilst similar results were obtained as regards ink acceptance of the lighter tones of the plate, a greater time was required to clean the plate, than when the aqueous solution of Example 3 was used.

EXAMPLE 5

Example 1 was repeated using as the radiation sensitive coating a mixture of 1 part of 4′-methoxy-diphenylamino-4-diazonium chloride and 4 parts of a cresol based novolak resin (VL 6859) and, as the liquid composition, the following mixture:

n-Butanol: 5%;
White Spirit: 66%;
Turpentine: 25.5%;
Paraffin wax: 2%;

Phthalocyanine;

Blue pigment: 1.5%;

The plate was cleaned with the aqueous solution of Example 3 and wet-inked with black ink in the normal manner. Results similar to those of Example 1 were obtained.

EXAMPLE 6

Example 5 was repeated using, as the radiation sensitive coating, a naphthoquinone 1,2-diazide 2,5-sulphonic acid ester of a novolak resin (VL 6859). Similar results were again obtained.

EXAMPLE 7

Example 1 was repeated except that the treatment with the liquid composition and the final cleaning treatment were omitted. It was impossible to tell from a visible inspection of the plate whether the lighter tones would print correctly and when the plate was placed on the press several hundred revolutions of the press were necessary before these tones began to print correctly.

EXAMPLE 8

Examples 1–6 were repeated except that the radiation sensitive plates were exposed through a half-tone screen. In all cases plates were found to accept ink readily when placed on the press.

EXAMPLE 9

Example 7 was repeated except that the radiation sensitive plate was exposed through a half-tone screen. The resultant plate was reluctant to accept ink.

I claim:

1. A method of processing a radiation sensitive plate comprising a substrate coated with a layer of a positive-working radiation sensitive material comprising a novolak resin sensitized with a diazonium salt or a quinone diazide, which method comprises:

(i) image-wise exposing the layer to actinic radiation using a continuous tone original in the absence of a half-tone screen, (ii) developing the image-wise exposed layer to selectively remove the radiation-struck portions of the layer and reveal the substrate underlying these portions and desensitising the revealed substrate to render the same oleophobic, (iii) drying the developed and desensitised plate, (iv) coating the dried plate with a liquid composition comprising (a) an oleophilic film-forming material which is a liquid hydrocarbon solution of a normally solid material selected from the group consisting of solid hydrocarbons, solid fats, and mixtures thereof, wherein the liquid hydrocarbon constitutes from 60% to 95% by weight of the composition, and the normally solid material constitutes from 0.5 to 5% by weight of the composition, and (b) an organic solvent liquid constituting from 0.1 to 30% by weight of the composition which is capable of softening the surface of the non-radiation-struck portions, (v) drying the coated plate to form an oleophilic layer on the non-radiation-struck portions and on said revealed substrate, and (vi) washing the plate to remove the oleophilic layer from said revealed substrate.

2. A method according to claim 1 wherein the developing and the desensitising are effected in a single processing step by utilising a developer having desensitising properties.

3. A method according to claim 2 wherein the developer comprises sodium silicate.

4. A method according to claim 1 wherein the liquid composition additionally includes a colourant.

5. A method according to claim 4 wherein the colourant constitutes up to 5% by weight of the composition.

6. A method according to claim 1 wherein the organic solvent liquid is an alcohol, an ester or a ketone.

7. A method according to claim 6 wherein the alcohol is ethanol, iso propanol, n-butanol, 2-ethyl hexanol or 1-octanol, wherein the ester is n-hexyl acetate, diethyl phthalate or diethyl carbonate; or wherein the ketone is 2,6-dimethyl-4-heptanone, 3-methyl-2-pentanone or 4-methyl-2-pentanone.

8. A method according to claim 1 wherein the normally solid material is gilsonite, a naturally occurring wax, a paraffin wax, a fat, or mixture of two or more thereof.

9. A method according to claim 1 wherein the plate is washed using an aqueous acidic or alkaline solution containing an organic solvent liquid.

10. A method according to claim 9 wherein the aqueous solution additionally includes a polymeric desensitising material.

* * * * *